(12) United States Patent
Bancal et al.

(10) Patent No.: US 6,380,793 B1
(45) Date of Patent: Apr. 30, 2002

(54) VERY HIGH VOLTAGE SWITCH

(75) Inventors: Bernard Bancal, Luynes; Philippe Peyron, Palette-le Tholonet, both of (FR)

(73) Assignee: Pixtech S.A. (FR)

( * ) Notice: Subject to any disclaimer, the term of this patent is extended or adjusted under 35 U.S.C. 154(b) by 0 days.

(21) Appl. No.: 09/698,376

(22) Filed: Oct. 27, 2000

(30) Foreign Application Priority Data

Oct. 28, 1999 (FR) .............................................. 99 13752

(51) Int. Cl.[7] .......................................... H03K 17/687
(52) U.S. Cl. ....................... 327/427; 327/436; 327/389; 327/108; 326/83
(58) Field of Search .................................. 327/108, 112, 327/427, 434, 436, 379, 384, 309, 310, 581, 389, 374, 377, 376, 325; 326/83, 87

(56) References Cited

U.S. PATENT DOCUMENTS

| | | | | |
|---|---|---|---|---|
| 5,111,084 A | * | 5/1992 | Suko .......................... | 327/108 |
| 5,467,047 A | * | 11/1995 | Robb .......................... | 327/427 |
| 5,886,563 A | * | 3/1999 | Nasila ......................... | 327/427 |
| 6,097,235 A | * | 8/2000 | Hsu et al. .................... | 327/309 |

OTHER PUBLICATIONS

D'Yakonov et al.; Nanosecond push–pull switches using high–power MOS transistors; Instruments and Experimental Techniques, vol. 26, No. 2, Mar. 1983; pp. 350–352.

* cited by examiner

*Primary Examiner*—Toan Tran
*Assistant Examiner*—Long Nguyen
(74) *Attorney, Agent, or Firm*—Duane Morris LLP; Arthur L. Plevy

(57) ABSTRACT

A push-pull switch including a first N-channel MOS transistor, the drain-source path of which is connected between a high voltage terminal and an output terminal, a first resistor connected between the gate of the first transistor and the high voltage, a diode having its anode connected to the output terminal and its cathode connected to the gate of the first transistor, a second N-channel MOS transistor having its drain connected to the cathode of the diode, its source connected to a reference potential, and its gate connected to a control terminal, and a second resistor connected between the gate of the second transistor and the output terminal.

3 Claims, 1 Drawing Sheet

VERY HIGH VOLTAGE SWITCH

BACKGROUND OF THE INVENTION

1. Field of the Invention

The present invention relates to a very high voltage switch and more specifically to a push-pull switch.

2. Discussion of the Related Art

In prior art, push-pull switches generally contain transistors of complementary types, that is, NPN and PNP bipolar transistors or N-channel and P-channel MOS transistors. This does not enable choosing optimal components when high-voltage switches are desired.

On the other hand, conventionally, when very high voltage switches are desired, components that can withstand as high a voltage as possible are used and this requires manufacturing specific components at high costs.

SUMMARY OF THE INVENTION

A first object of the present invention is to provide a push-pull type switch in which all transistors are of the same type.

Another object of the present invention is to provide such a switch likely to withstand very high voltages.

To achieve these objects, the present invention provides a push-pull switch including a first N-channel MOS transistor, the drain-source path of which is connected between a high voltage terminal and an output terminal, a first resistor connected between the gate of the first transistor and the high voltage terminal, a diode having its anode connected to the output terminal and its cathode connected to the gate of the first transistor, a second N-channel MOS transistor having its drain connected to the cathode of the diode, its source connected to a reference potential, and its gate connected to a control terminal, and a second resistor connected between the gate of the second transistor and the output terminal.

According to an embodiment of the present invention, each of the MOS transistors has its source connected to its substrate.

According to an embodiment of the present invention, a third resistor is arranged in series with the gate of the second transistor, the second terminal of this third resistor being connected to the second resistor and to a protection diode having its second terminal connected to the reference diode.

According to an embodiment of the present invention, each of the first and second transistors is replaced with a chain of series transistors, and each of the first and second resistors is replaced with a corresponding chain of resistors, the resistors of each of the chains being equal, fourth equal resistors being connected between the gates of the transistors connected to the high potential and fifths resistors being connected between the gates of the transistors connected to the low voltage.

The foregoing objects, features and advantages of the present invention will be discussed in detail in the following non-limiting description of specific embodiments, in conjunction with the accompanying drawings.

DETAILED DESCRIPTION

Figure 1:
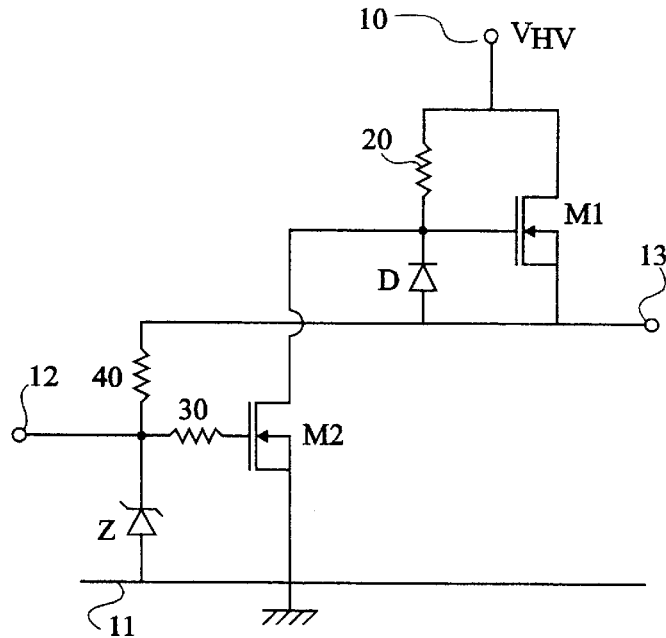
FIG. 1 shows a first embodiment of the present invention.

FIG. 1 shows a switching circuit of push-pull type which, according to an advantage of the present invention, only includes high-voltage MOS transistors of same type. The circuit is connected between a high-voltage terminal 10, a reference potential 11, currently the ground, a control terminal 12, and an output terminal 13.

Between high-voltage terminal 10 and output terminal 13 is arranged a first N-channel MOS transistor M1 having its gate connected to terminal 10 by a resistor 20 and to the source via a diode D. The anode of the diode is connected to the source of transistor M1 and its cathode is connected to the gate. The cathode of diode D is also connected to reference terminal 11 via a second N-channel MOS transistor M2. The gate of transistor M2 is connected to a first terminal of a resistor 30. The second is terminal of resistor 30 is connected to control terminal 12, to reference terminal 11 via a protection diode Z, and to output terminal 13 via a resistor 40. Resistors 30 and 40 are biasing resistors of high values and transistors M1 and M2 both have their substrate connected to their sources.

The operation of this circuit is the following. Assume that in an initial state, transistor M1 is on and transistor M2 is off, control terminal 12 being at a low level. Then, output terminal 13 is at a high voltage value. Assuming that the gate of transistor M1 is substantially at the value of the high potential of terminal 10 ($V_{HV}$), the potential on terminal 13 is $V_{HV} - V_T$, $V_T$ being the threshold voltage of transistor M1. The induced consumption is negligible if the device is a high-voltage but low power device. When a high-level control signal is applied to terminal 12, this tends to turn transistor M2 on. Accordingly, diode D turns on and the voltage between the source and the gate of transistor M1 becomes equal to the forward voltage drop ($V_F$) of diode D. Transistor M1 is then reverse-biased and turns off.

Accordingly, output terminal 13 is connected to terminal 11 by diode D and transistor M2. The output potential becomes substantially equal to $V_F$. Indeed, the voltage drop across transistor M2 can be neglected, this transistor being then equivalent to a resistor of very low value as compared to resistance 20.

The previously-described circuit has the advantage of forming a push-pull switch with power transistors M1 and M2 of the same type: both are N-channel MOS enrichment transistors with their source connected to their substrate. This enables choosing identical fast transistors that can withstand high voltages. The system also has the advantage of being controlled by a single instruction on terminal 12.

According to another aspect of the present invention, a diagram of the type of that in FIG. 1 is used to distribute the voltages between several N-channel MOS transistors. This results in that, to switch, for example, a 3,000-V voltage, three transistors may be used that can withstand a 1,000-V voltage in each of the branches of the push-pull switch.

Figure 2:
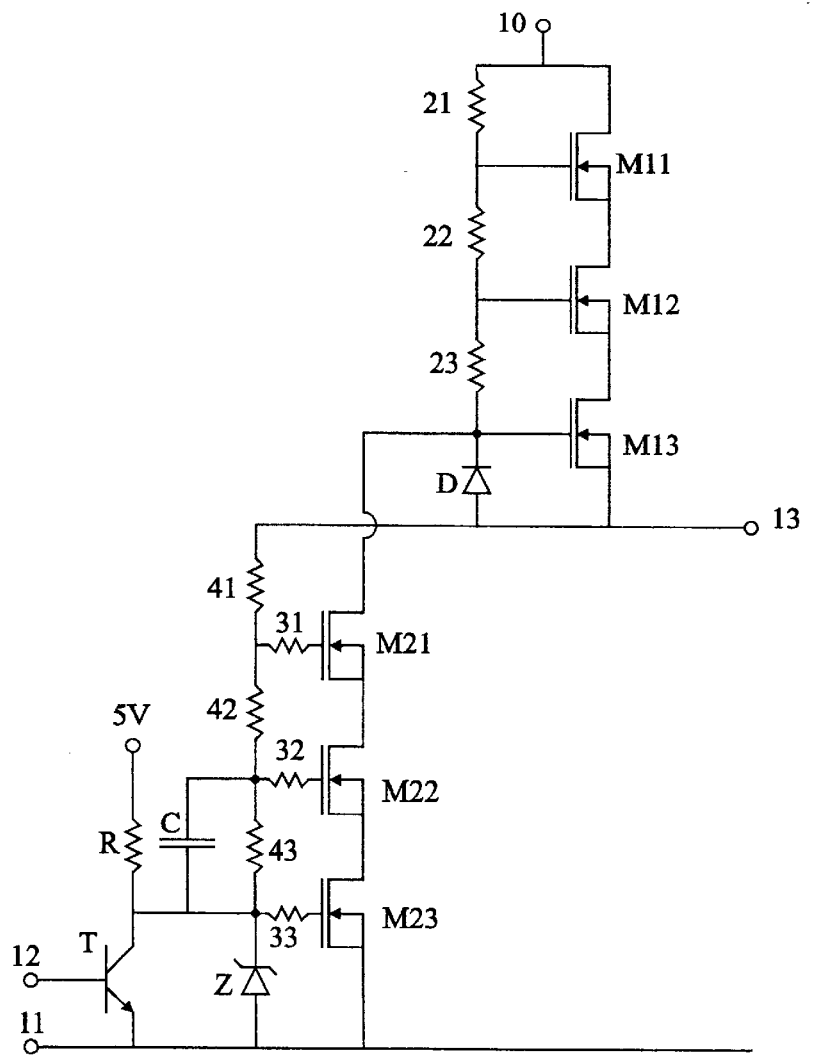
FIG. 2 shows a second embodiment of the present invention.

FIG. 2 shows an example of such a diagram. The circuit of FIG. 2, like the circuit of FIG. 1, is connected between high-voltage, reference, control and output terminals 10, 11, 12, and 13. Transistor M1 is replaced with a chain of three transistors M11, M12, M13. The gate of transistor M11 is connected to terminal 10 by a resistor 21, the gate of transistor M12 is connected to the gate of transistor M11 by a resistor 22. The gate of transistor M13 is connected to the gate of transistor M12 by a resistor 23. A diode D is connected by its anode to the source of transistor M13 (terminal 13) and by its cathode to the gate of transistor M13. The cathode of diode D is also connected to a chain of transistors M21 to M23 that replace transistor M2. Each of transistors M21, M22, M23 has its gate connected to a first terminal of a biasing resistor 31, 32, 33. The second terminal of resistor 31 is connected to terminal 13 by a resistor 41, the second terminal of resistor 32 is connected to the gate of transistor M21 by a resistor 42, and the second terminal of resistor 33 is connected to the gate of transistor M22 by a resistor 43. A protection diode Z is connected between the gate and the source of transistor M23.

Preferably, a capacitor C is arranged in parallel on lower biasing resistor 43 and the control is applied on terminal 12 via an inverter including a resistor R having a first terminal connected to a high voltage (on the order of 5 V) and a second terminal connected to the collector of a transistor T, the emitter of which is connected to terminal 11 and the base of which is connected to terminal 12.

The operation of the circuit of FIG. 2 is similar to that of FIG. 1. The series connection of transistors M11 to M13 being associated with a chain of gate biasing resistors of same values 21 to 23, the potentials distribute equally between these transistors without risking to exceed a breakdown voltage (drain-source, drain-gate, or source-gate) of one of these transistors. Similarly, transistors M21 to M23 being associated with biasing resistors of same values 41 to 43, the voltages distribute equally between these transistors. Thus, none of transistors M11 to M13 and none of transistors M21 to M23 is likely to withstand a voltage greater than one third of the supply voltage.

In more detail, assuming that terminal 13 initially is at high voltage, that is, the control signal on terminal 12 is at a high level, so that the collector of transistor T and the gate of transistor M23 are low, transistors M21 to M23 are off and transistors M11 to M13 are on. As previously, terminal 13 is at high potential $V_{HV}$ minus threshold voltage $V_T$ of transistor M13. When the signal on terminal 12 is brought down to zero, the gate of transistor M23 biases to the high level and this transistor tends to turn on. Due to the existence of resistor chain 41–43, the same voltage appears across transistors M21–M23 and the three transistors simultaneously become progressively conductive. Then, diode D turns on and, as previously, transistor M13 tends to turn off, which turns off transistors M11 and M12, the same gate-source voltages appearing on each of these transistors due to the existence of resistor chain 21, 22, 23.

It has been previously indicated that all three resistances 21 to 23 are equal, as well as all three, resistances 41 to 43. These resistances are preferably chosen to be high to reduce the static consumption of the switch. However, to increase the switching speed upon setting to zero, the value of resistances 41 to 43 may be decreased. Similarly, to increase the switching speed upon setting to the high state, the value of resistances 21 to 23 may be decreased.

In an example of implementation, the six transistors are N-channel enrichment MOS transistors, each of which withstands a 1,000-V voltage. Resistors 21 to 23 and 41 to 43 are all equal to 1.6 M Ω. In this case, a rise time on the order of 150 μs and a fall time on the order of 50 μs are obtained.

An advantage of the present invention is that , as will is be understood by those skilled in the art, the number of transistors can be increased or decreased. To withstand 5,000-V voltages, a chain of five N-channel MOS transistors may for example be provided with no disadvantages in each of the branches of the push-pull switch, each of these transistors being able to withstand 1,000 V.

Of course, the present invention is likely to have various alterations, modifications, and improvements which will readily occur to those skilled in the art. For example, the provision of a capacitor C in parallel on resistor 43 is optional.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A push-pull switch comprising:
    a first N-channel MOS transistor (M1), wherein a drain-source path of which is connected between a voltage terminal (10) and an output terminal (13);
    a first resistor (20) connected between the gate of the first N-channel MOS transistor and the high voltage terminal;
    a diode (D) having its anode connected to the output terminal (13) and its cathode connected to the gate of the first N-channel MCS transistor;
    a second N-channel MOS transistor (M2) having its drain connected to the cathode of the diode, its source connected to a reference potential, and its gate connected to a control terminal; and
    a second resistor (40) connected between the gate of the second N-channel MOS transistor and the output terminal (13).

2. The push-pull switch of claim 1, wherein each of the N-channel MOS transistors has its source connected to its substrate.

3. The push-pull switch of claim 1, further including a third resistor (30) having a first terminal connected to the gate of the second N-channel MOS transistor, and a second terminal connected to the second resistor and to a first terminal of a protection diode (Z) having its second terminal connected to the reference potential.

* * * * *